United States Patent
Bhuyan et al.

(10) Patent No.: US 11,859,278 B2
(45) Date of Patent: Jan. 2, 2024

(54) MOLECULAR LAYER DEPOSITION OF AMORPHOUS CARBON FILMS

(71) Applicants: Applied Materials, Inc., Santa Clara, CA (US); National University of Singapore, Singapore (SG)

(72) Inventors: Bhaskar Jyoti Bhuyan, San Jose, CA (US); Mark Saly, Santa Clara, CA (US); Ahbijit Basu Mallick, Palo Alto, CA (US); Eugene Yu Jin Kong, Singapore (SG); Bo Qi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 325 days.

(21) Appl. No.: 16/817,120

(22) Filed: Mar. 12, 2020

(65) Prior Publication Data
US 2021/0277516 A1  Sep. 9, 2021

Related U.S. Application Data

(60) Provisional application No. 62/986,768, filed on Mar. 8, 2020.

(51) Int. Cl.
| | | |
|---|---|---|
| C23C 16/26 | (2006.01) | |
| H01L 23/532 | (2006.01) | |
| H01L 21/02 | (2006.01) | |

(52) U.S. Cl.
CPC ........ *C23C 16/26* (2013.01); *H01L 21/02115* (2013.01); *H01L 21/02274* (2013.01); *H01L 23/53295* (2013.01)

(58) Field of Classification Search
CPC .............. C23C 16/26; H01L 21/02274; H01L 23/53295
See application file for complete search history.

(56) References Cited

U.S. PATENT DOCUMENTS

| | | | |
|---|---|---|---|
| 10,464,953 B2* | 11/2019 | Wang | C23C 16/45542 |
| 2006/0199260 A1* | 9/2006 | Zhang | C12M 23/24 |
| | | | 435/293.1 |
| 2009/0220722 A1* | 9/2009 | Wang | H01M 4/96 |
| | | | 428/64.1 |
| 2010/0008021 A1* | 1/2010 | Hu | C01B 32/05 |
| | | | 427/79 |
| 2014/0045342 A1* | 2/2014 | Mallick | H01L 21/0262 |
| | | | 438/778 |
| 2015/0056555 A1* | 2/2015 | Lin | G03F 7/11 |
| | | | 430/311 |

(Continued)

FOREIGN PATENT DOCUMENTS

| | | |
|---|---|---|
| EP | 0162706 B1 | 2/1991 |
| WO | 2007049939 A1 | 5/2007 |

*Primary Examiner* — Monica D Harrison
*Assistant Examiner* — Andre C Stevenson
(74) *Attorney, Agent, or Firm* — Servilla Whitney LLC

(57) ABSTRACT

Methods of forming carbon polymer films are disclosed. Some methods are advantageously performed at lower temperatures. The substrate is exposed to a first carbon precursor to form a substrate surface with terminations based on the reactive functional groups of the first carbon precursor and exposed to a second carbon precursor to react with the surface terminations and form a carbon polymer film. Processing tools and non-transitory memories to perform the process are also disclosed.

16 Claims, 4 Drawing Sheets

(56) References Cited

U.S. PATENT DOCUMENTS

2016/0365242 A1* 12/2016 Jung .................... H01L 21/0271
2018/0096842 A1* 4/2018 Varadarajan .......... C23C 16/401
2019/0148235 A1 5/2019 Wang

* cited by examiner

MOLECULAR LAYER DEPOSITION OF AMORPHOUS CARBON FILMS

CROSS-REFERENCE TO RELATED APPLICATIONS

This application claims priority to U.S. Provisional Application No. 62/986,768, filed Mar. 8, 2020, the entire disclosure of which is hereby incorporated by reference herein.

TECHNICAL FIELD

Embodiments of the present disclosure generally relate to methods for depositing or forming amorphous carbon films. Some embodiments of the disclosure relate to molecular layer deposition (MLD) processes for forming amorphous carbon films.

BACKGROUND

Carbon-based films are important for semiconductor patterning applications, especially as hard mask materials. Most hard mask films are grown by plasma-enhanced chemical vapor deposition (PECVD). These PECVD films are typically used for applications using blanket deposition.

Another potential use of carbon-based films is as graphitic films for back-end-of-line (BEOL) barrier layers. Currently, carbon-based films are grown by physical vapor deposition (PVD) or PECVD processes. Conventional processes can form high quality carbon films but film conformality remains an issue. The inability to deposit a conformal film limits the usefulness of these carbon-based films.

Accordingly, there is a need for methods of depositing carbon-based films with improved conformality.

SUMMARY

One or more embodiments of the disclosure are directed to a method of forming a carbon polymer films. The method comprises exposing a substrate to a first carbon precursor to form a first precursor terminated surface on the substrate. The first precursor terminated surface is exposed to a second carbon precursor to form a carbon polymer film on the substrate.

Additional embodiments of the disclosure are directed to processing tools comprising a central transfer station with at least one deposition chamber and at least one annealing chamber connected to a side of the central transfer station, and a controller. The controller has one or more of: a configuration to move a substrate from the central transfer station to the at least one deposition chamber; a configuration to move a substrate from the at least one deposition chamber to the central transfer station; a configuration to move a substrate from the central transfer station to the at least one annealing chamber; a configuration to move a substrate from the at least one annealing chamber to the central transfer station; a configuration to expose a substrate to a first carbon precursor to form a first precursor terminated surface on the substrate; a configuration to expose the substrate to a second carbon precursor to react with the first precursor terminated surface to form a carbon polymer film on the substrate; a configuration to expose the carbon polymer film on a substrate to a plasma treatment; and a configuration to anneal the carbon polymer film.

Further embodiments of the disclosure are directed to non-transitory computer readable medium including instructions, that, when executed by a controller of a processing chamber, causes the processing chamber to perform operations to: expose a substrate to a first carbon precursor in a processing chamber; purge the processing chamber of the first carbon precursor; expose the substrate a second carbon precursor in the processing chamber; purge the processing chamber of the second carbon precursor; move the substrate from the processing chamber to an annealing chamber; and/or anneal the substrate in the annealing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
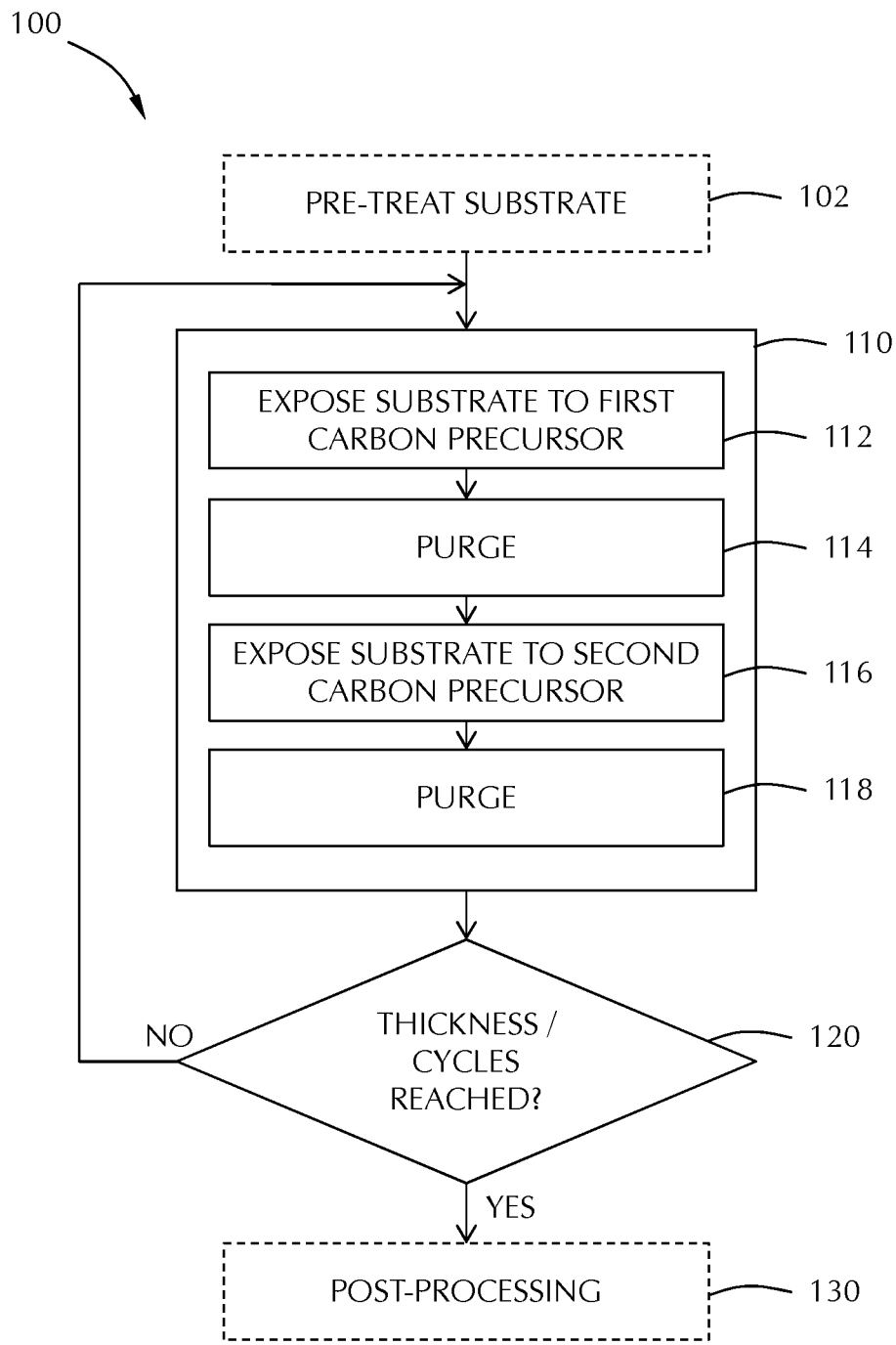
FIG. 1 illustrates a process flow diagram of a method according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a layer or partial layer has been deposited onto a substrate surface, the exposed surface of the newly deposited layer may also be described as the substrate surface. In one or more embodiments, the substrate comprises on or more of titanium nitride (TiN), silicon (Si), cobalt (Co), titanium (Ti), silicon dioxide (SiO$_2$), copper (Cu), and black diamond (BD).

One or more embodiments of the disclosure are directed to methods for forming carbon films. The terms "carbon film" and "carbon-based films" are used interchangeably herein. In some embodiments, carbon films are deposited by a molecular layer deposition (MLD) process. Some embodiments of the disclosure advantageously provide methods for depositing carbon films with increased conformality. By MLD, conformality can be increased at the cost of thermal stability. Typically, polymer condensation reactions take place at lower temperatures as the monomeric species desorb from the substrates at elevated temperatures. Therefore, carbon-based films deposited by MLD are generally unstable at higher temperatures due, in part, to poor density of the film. In some embodiments, the thermal stability of the film is increased by plasma post-deposition processes.

Molecular layer deposition is a gas-phase self-limiting technique similar to atomic layer deposition (ALD). Like ALD, MLD processes generally include sequential self-limiting surface reactions to deposit a film. In MLD processes, the precursors can include organic compounds, rather than metal compounds; although metal species can be used. The organic compounds of MLD processes can include bifunctional organic molecules, enabling film growth by a polymerization-type reaction.

Due to self-limiting behavior of MLD processes, conformal films can be achieved. A "conformal film", as used herein, refers to a film with substantially equal thicknesses at the tops, sides and bottoms of substrate surface features (e.g., trenches, vias). In some embodiments, a "conformal film" has a thickness at the top of a feature (outside of the feature) that is within ±20%, 15%, 10%, 5%, 2% or 1%, based on an average thickness. While conformal films can be formed, MLD-based films are often thermally unstable above ~200° C., which is significantly lower than the common target stability of ~400° C. Some embodiments of the disclosure advantageously provide MLD carbon-based films within stability greater than 200° C., 250° C., 300° C. or higher. Some embodiments provide methods to deposit C-based films with thermal stability greater than or equal to 400° C.

Some embodiments of the disclosure advantageously provide methods for depositing carbon-based films with tunable carbon (C), hydrogen (H), nitrogen (N) and/or oxygen (O) ratios. Some embodiments use different monomers with different C, H, N and O ratios, enabling better tuning of the material properties. In some embodiments, carbon-based films are deposited with tunable C, H, N and O ratios that withstand 400° C. annealing. Some embodiments provide plasma enhanced MLD depositions of high quality carbon-based films with high thermal resistance.

One or more embodiments of the disclosure are directed to methods to grow conformal carbon-based films on high aspect ratio (HAR) structures with a depth greater than one micron (1 μm). Some embodiments provide methods to form conformal carbon-based films on HAR structures with critical dimension (CD) of ~300 nm.

One or more embodiments of the disclosure provide carbon-based films by plasma-enhanced molecular layer deposition (PEMLD or PE-MLD). In some embodiments, carbon-based films are deposited with thermal stability improved to ~400° C. by using plasma enhanced MLD growth.

The MLD methods of one or more embodiments use one or more polymerizable precursors to deposit amorphous carbon films. Some embodiments of the disclosure provide methods for forming amorphous carbon films with improved thickness control.

In an exemplary reaction, 1,4-phenylene diisocyanate (DIC) and ethylene diamine (EDA) are used to form a carbon polymer film with a chemical formula [C$_{10}$H$_{12}$N$_4$O$_2$]$_n$. The growth per cycle (GPC) of some embodiments decreases with pedestal temperature. In some embodiments, the GPC saturates at purge times of 30 seconds or greater, indicative of an ALD type process. In some embodiments, the film formed demonstrates the presence of C, H, N and O in the film, by FTIR analysis at 80° C. In some embodiments, x-ray photoelectron spectroscopy (XPS) analysis at 80° C. shows a carbon rich film deposited with a maximum carbon content of about 81% (or greater). In some embodiments, the elemental surface scan confirms similar compositions for thinner films. In some embodiments, the films are thermally stable up to 200° C., or even up to 300° C.

Some embodiments use thermal annealing and/or a plasma treatment to improve thermal stability of the deposited film. In some embodiments, post-deposition treatment densifies or alters the film properties to make the film more thermally stable. In some embodiments, a plasma treatment (e.g., nitrogen plasma) is performed after each, or several, MLD cycles.

According to one or more embodiments, the method uses a molecular layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

"Molecular layer deposition", as used herein, refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain MLD process, exposure to each reactive compound is separated by a time delay to allow each compound to adhere and/or react on the substrate surface and then be purged from the processing chamber. These reactive compounds are said to be exposed to the substrate sequentially. In a spatial MLD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain MLD process, a first reactive gas (i.e., a first precursor or compound A, e.g. aromatic precursor) is pulsed into the reaction zone followed by a first time delay. Next, a second precursor or compound B (e.g. oxidant) is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the MLD process of pulsing compound A, purge gas, compound B and purge gas is a cycle. A cycle can start with either compound A or compound B and continue the respective order of the cycle until achieving a film with the predetermined thickness.

In an embodiment of a spatial MLD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

FIG. 1 illustrates a process flow diagram of a method 100 in accordance with one or more embodiments of the disclosure. The method 100 illustrated in FIG. 1 is representative of an molecular layer deposition (MLD) process, in which the reactive gases are exposed to the substrate separately to avoid gas phase reactions between the reactive gases.

With reference to FIG. 1, the method 100 comprises a deposition cycle 110. The method 100 begins at optional operation 102 by preparing the substrate to be processed. In some embodiments, preparing the substrate 102 includes a pre-treatment operation. The pre-treatment can be any suitable pre-treatment known to the skilled artisan. Suitable pre-treatments include, but are not limited to, pre-heating, cleaning, soaking, native oxide removal, or deposition of an adhesion layer (e.g. titanium nitride (TiN)). In some embodiments, the pre-treatment process comprises a process that forms amine terminations on the substrate surface. In some embodiments, the pre-treatment process soaks the substrate in the same reactive species used as the second carbon precursor, as described further below.

At deposition 110, a process is performed to deposit a carbon polymer film on the substrate (or substrate surface). In some embodiments, the process is performed to deposit a carbon polymer hard mask on the substrate. The deposition 110 process illustrated in FIG. 1 can be performed in a time-domain type process or a spatially separated process.

At operation 112, the substrate (or substrate surface) is exposed to a first carbon precursor to form a first precursor terminated surface on the substrate. The first precursor terminated surface has an active site, region or moiety that is available for reaction with a different reactive species. The first carbon precursor does not react with the active site, region or moiety of the first precursor terminated surface so that a self-limiting reaction occurs.

The first carbon precursor of some embodiments comprises an organic compound. In some embodiments, the first carbon precursor comprises an aromatic compound. In some embodiments, the first carbon precursor comprises more than one functional group. As used in this manner, a functional group is any reactive region or moiety of the compound that can react with either the substrate surface or with a second reactive species. In some embodiments, the first carbon precursor comprises two functional groups. In some embodiments, the first carbon precursor comprises two of the same functional groups. The functional groups can be any suitable functional groups capable of reacting with the substrate surface and/or the second carbon precursor, as described below. Suitable functional groups include, but are not limited to, cyano (—CN), cyanate (—OCN), isocyanate (—NCO), thiocyanate (—SCN), isothiocyanate (—NCS), and/or amines (—NR$_2$). In some embodiments, the first precursor comprises or consists essentially of 1,4-phenylene diisocyanate (DIC). As used in this specification and the appended claims, the term "consists essentially of" means that the reactive species in the subject reaction or process step is greater than or equal to about 95%, 98%, 99% or 99.5% of the stated species, on a molar basis. In some embodiments, the first precursor terminated surface comprises isocyanate terminations (also referred to as isocyanoto terminations or groups).

In some embodiments, the first precursor comprises an aromatic compound. As used herein, in one or more embodiments, the term "aromatic precursor" or "aromatic compound" refers to precursors that are aromatic. As recognized by one of skill in the art, aromaticity is a property of cyclic (ring-shaped), planar (flat) structures with a ring of resonance bonds that gives increased stability compared to other geometric or connective arrangements with the same set of atoms. Aromatic molecules are very stable, and do not break apart easily to react with other substances. Aromaticity describes a conjugated system often made of alternating single and double bonds in a ring. This configuration allows for the electrons in the molecule's pi system to be delocalized around the ring, increasing the molecule's stability.

In one or more embodiments, the aromatic precursor can comprise any aromatic precursor known to the skilled artisan. In some embodiments, the aromatic precursor comprises one or more of benzene, substituted benzene, naphthalene, substituted naphthalene, anthracene, and substituted anthracene. In one or more embodiments, the aromatic precursor may be substituted with one or more alkyl group, one or more alkoxy group, one or more vinyl group, one or more silane group, one or more amine group, or one or more halide.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

As used herein, the term "alkoxy" includes any of the above alkyl groups linked to an oxygen atom.

As used herein, the terms "vinyl" or "vinyl-containing" refer to groups containing the vinyl group (—CH═CH$_2$).

As used herein, the term "amine" relates to any organic compound containing at least one basic nitrogen atom, e.g. NR'$_2$, wherein wherein R' is independently selected from hydrogen (H) or alkyl.

As used herein, the term "silane" refers to a compound SiR'$_3$, wherein R' is independently selected from hydrogen (H) or alkyl.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F−), chloride (Cl−), bromide (Br−), iodide (I−), and astatide (At−).

The substrate may be any substrate known to one of skill in the art. In one or more embodiments, the substrate comprises on or more of titanium nitride (TiN), silicon (Si), cobalt (Co), titanium (Ti), silicon dioxide (SiO$_2$), copper (Cu), and black diamond (BD).

The substrate can be maintained at any suitable temperature depending on, for example, the thermal budget of the device being formed, the reactive species, degradation temperatures, etc. In some embodiments, the substrate is maintained at a temperature less than 100° C. In some embodiments, the substrate is maintained at a temperature in the range of 50° C. to 100° C., or in the range of 60° C. to 95° C., or in the range of 70° C. to 85° C.

At operation 114, the processing chamber is purged. Purging (i.e. creating a vacuum) can be accomplished with any suitable gas that is not reactive with the substrate, film on the substrate, and/or processing chamber walls. Suitable purge gases include, but are not limited to, N$_2$, He, and Ar. The purge gas may be used to purge the processing chamber of the aromatic precursor, and/or the oxidant. In some embodiments, the same purge gas is used for each purging operation. In other embodiments, a different purge gas is used for the various purging operations.

At operation 114, the processing chamber is purged to remove unreacted aromatic precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the tellurium precursor by any suitable technique including, but not limited to, moving the substrate through a gas curtain to a portion or sector of the processing chamber that contains none or substantially none of the aromatic precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate is exposed to a second carbon precursor. The second carbon precursor of some embodiments is a different compound than the first carbon precursor. The second carbon precursor reacts with the first precursor terminated surface to form a carbon polymer film on the substrate. In some embodiments, the second carbon precursor comprises a compound with two or more functional groups. In some embodiments, the second carbon precursor comprises two functional groups. In some embodiments, the second carbon precursor comprises two of the same functional groups. The functional groups of the second carbon precursor can be any suitable functional groups capable of reacting with the substrate surface, the first precursor terminated surface and/or the first carbon precursor. Suitable functional groups include, but are not limited to, cyano (—CN), cyanate (—OCN), isocyanate (—NCO), thiocyanate (—SCN), isothiocyanate (—NCS), aldehyde (—CHO), acyl chloride (—COCl), acid anhydride (—C(O)OC(O)—), amines (—NR$_2$) and/or amides (—C(O)NR$_2$), where each R is independently selected from hydrogen, C1-C6 alkyl group. In some embodiments, the second carbon precursor comprises or consists essentially of one or more of ethylene diamine (EDA) or phenylene diamine (PDA).

At operation 118, the processing chamber is purged of unreacted second carbon precursor. Purging (i.e. creating a vacuum) can be accomplished with any suitable gas that is not reactive with the substrate, film on the substrate, and/or processing chamber walls. Suitable purge gases include, but are not limited to, N$_2$, He, and Ar. The purge gas may be used to purge the processing chamber of the aromatic precursor, and/or the oxidant. In some embodiments, the same purge gas is used for each purging operation. In other embodiments, a different purge gas is used for the various purging operations.

In one or more embodiments, the deposition process is carried out in a process volume at pressures in the range of 0.1 mTorr to 100 Torr, or in the range of 1 mTorr to 1 Torr, or at a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, and about 10 Torr.

The deposition cycle 110 may be performed until a predetermined thickness of carbon polymer film has been formed. At operation 120, the thickness of the formed carbon polymer film is evaluated to determine if it has reached the predetermined thickness. If not, the method 100 repeats deposition cycle 110, returning to operation 112 for further formation. If the predetermined thickness has been reached, the method 100 moves to optional post processing steps at operation 130, or the method 100 ends.

The optional post-processing operation 130 can be, for example, a process to modify film properties (e.g., annealing) or a further film deposition process (e.g., additional ALD, MLD or CVD processes) to grow additional films. In some embodiments, the optional post-processing operation 130 can be a process that modifies a property of the deposited film. In some embodiments, the optional post-processing operation 130 comprises annealing the as-deposited film. In some embodiments, annealing is done at temperatures in the range of about 100° C. to about 1100° C., or at a temperature greater than 300° C., 400° C., 500° C., 600° C., 700° C., 800° C., 900° C. or 1000° C. In some embodiments, the deposited film is plasma annealed. In some embodiments, the plasma anneal is any suitable type of plasma including, but not limited to, is conductively coupled plasma (CCP), inductively coupled plasma (ICP) using any suitable plasma power source (e.g., RF, DC, microwave). In some embodiments, the plasma anneal comprises a plasma gas selected from one or more of nitrogen ($N_2$), ammonia ($NH_3$) or argon (Ar). In some embodiments, the plasma anneal is a CCP without argon (Ar) as the plasma species. In some embodiments, annealing the as-deposited film increases the density, decreases the resistivity and/or increases the purity of the film. Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

In some embodiments, the carbon polymer film is annealed at a temperature up to 400° C. In some embodiments, annealing the carbon polymer film causes the carbon polymer film to decrease in thickness by an amount less than 20%, or 15% or 10%, relative to the as-deposited thickness.

Figure 2:
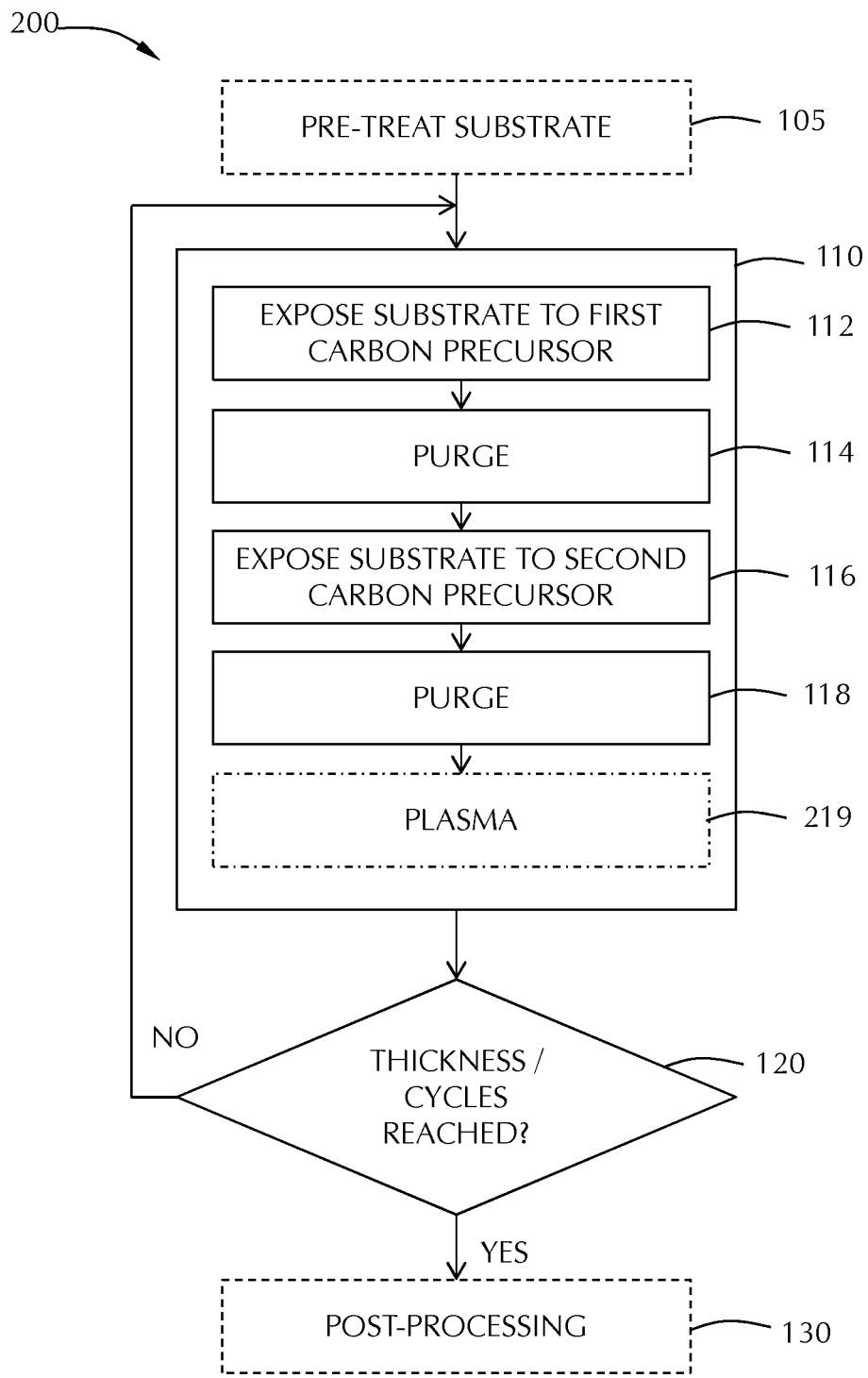
FIG. 2 illustrates a process flow diagram of a method according one or more embodiments of the disclosure.

In the embodiment illustrated in FIG. 1, the carbon polymer film is optionally treated with a plasma and/or annealing process after the predetermined film thickness has been formed. In the embodiment illustrated in FIG. 2, a plasma exposure process 219 is included in the deposition 110 cycle. The plasma exposure process 219 of some embodiments is performed with each deposition cycle. In some embodiments, the plasma exposure process 219 is performed after a number of deposition cycles in the range of 2 to 500, or in the range of 3 to 200, or in the range of 4 to 100, or in the range of 5 to 50, of in the range of 5 to 25, or in the range of 5 to 20 cycles.

In some embodiments, the second carbon precursor is exposed to the substrate in a carrier or dilution gas selected from helium (He), argon (Ar), xenon (Xe), nitrogen ($N_2$), or hydrogen ($H_2$). The dilution gas of some embodiments comprises a compound that is inert gas relative to the reactants and substrate materials. In some embodiments, the dilution or carrier gas is ignited into a plasma in a plasma enhanced MLD process. The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of dielectric.

Figure 3:
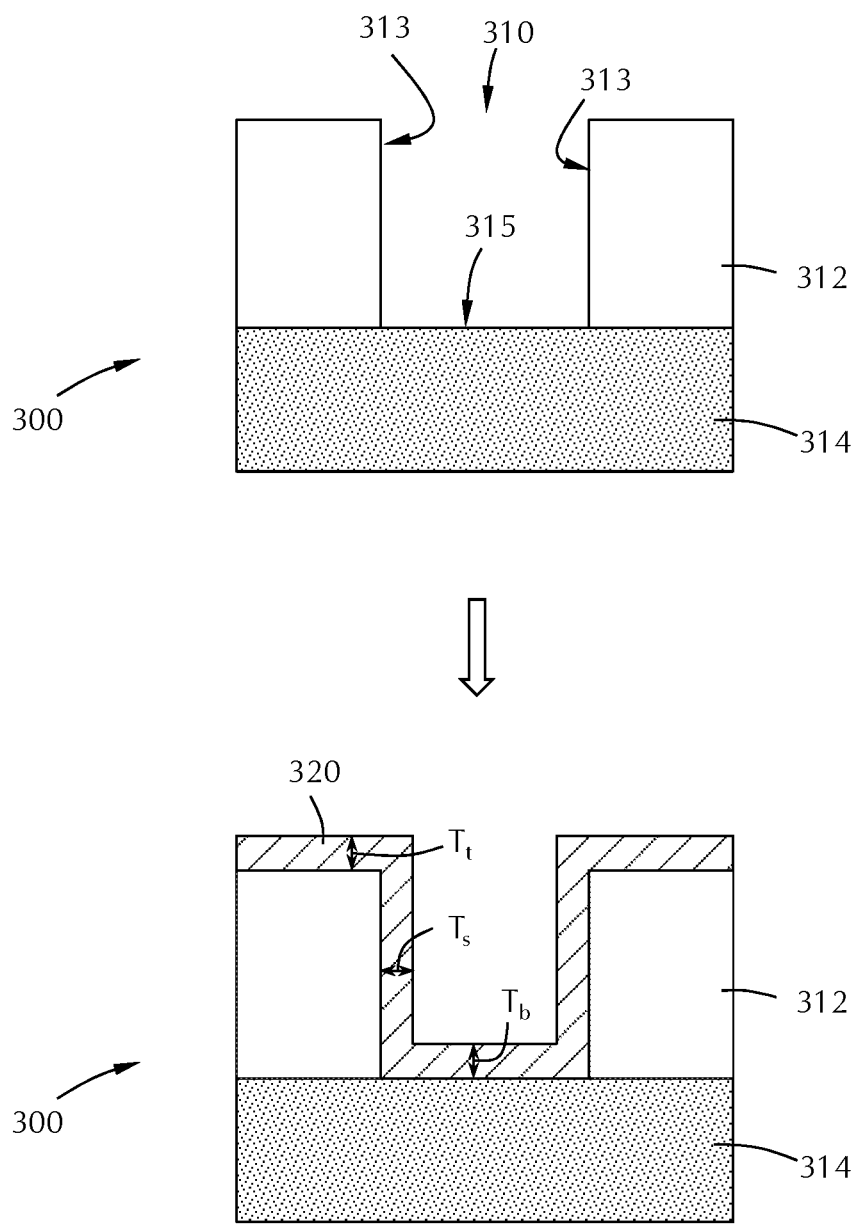
FIG. 3 illustrates a substrate feature with conformal carbon polymer film according to one or more embodiment of the disclosure.

In some embodiments, as illustrated in FIG. 3, the substrate 300 comprises one or more features 310. A substrate feature 310 is any intentionally formed recess or protrusion in the substrate surface. Suitable examples of features 310 include, but are not limited to, trenches, vias and pillars. The embodiment illustrated in FIG. 3 shows a trench with two sidewalls 312 and a bottom 314. The sidewalls 312 of some embodiments are a different material than the bottom 314. In some embodiments, the sidewalls 314 and the bottom 314 are the same material. In the embodiment shown, the bottom surface 315 of the feature 310 is a metal and the sidewall surfaces 313 are dielectrics. The skilled artisan will recognize that this is merely one possible configuration and that the bottom and sidewalls can be any materials, either the same or different. In some embodiments, the feature 310 has an aspect ratio (depth to width) greater than 5:1, 10:1, 15:1 or 20:1.

In some embodiments, as shown in FIG. 3, the carbon polymer film 320 is a conformal film. For example, as shown, the thickness at the top $T_t$, thickness on the sidewall $T_s$ and thickness on the bottom $T_b$ of the feature 310 are illustrated as being the same.

In some embodiments, the carbon polymer film formed is an alternating copolymer. An alternating copolymer is a copolymer with a regular alternating pattern of two materials. For example, the material formed by the first carbon precursor alternating with the material formed by the second carbon precursor.

In some embodiments, the carbon polymer film has carbon, nitrogen, oxygen and hydrogen atoms. In some embodiments, the carbon polymer film consists essentially of carbon, nitrogen, oxygen and hydrogen atoms. As used in this manner, the term consists essentially of means that the sum of the stated elements is greater than or equal to 95%, 98%, 99% or 99.5% of the total atomic makeup of the film. In some embodiments, the carbon polymer film comprises or consists essentially of carbon, nitrogen and oxygen atoms. In some embodiments, the carbon polymer film has a carbon content in the range of 40% to 90%, or in the range of 50% to 80%, or in the range of 60% to 70%. In some embodiments, the carbon content is greater than 30%, 40%, 50%, 60%, 70% or 80%. In some embodiments, the carbon polymer film has a nitrogen content in the range of 2% to 40%, or in the range of 3% to 35%, or in the range of 4% to 30%, or in the range of 5% to 25%, or in the range of 8% to 20%. In some embodiments, the nitrogen content is greater than 1%, 2%, 3%, 4%, 5%, 10%, 15% or 20%. In some embodiments, the carbon polymer film has an oxygen content in the range of 1% to 20%, or 2% to 18%, or 3% to 16% or 4% to 14% or 5% to 12%. In some embodiments, the oxygen content is greater than 1%, 2%, 3%, 4%, 5% or 6%.

In one or more embodiments, the deposition operation 110 is repeated to form a carbon polymer film having a predetermined thickness. In some embodiments, the deposition operation 110 is repeated to provide a carbon polymer film having a thickness greater than about 0.1 nm, or in the range of from about 0.1 nm to about 1000 nm, including from about 10 nm to about 500 nm, from about 10 nm to about 100 nm, from about 5 nm to about 50 nm, from about 10 nm to about 50 nm, or from about 20 nm to about 30 nm.

According to one or more embodiments, the substrate is subjected to processing prior to and/or after forming the layer. This processing can be performed in the same chamber or in one or more separate processing chambers. In one or more embodiments, the substrate is then moved to another processing chamber for further processing. The substrate can be moved directly from the physical vapor deposition chambers to the separate processing chamber, or it can be moved from the physical vapor deposition chambers to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 4:
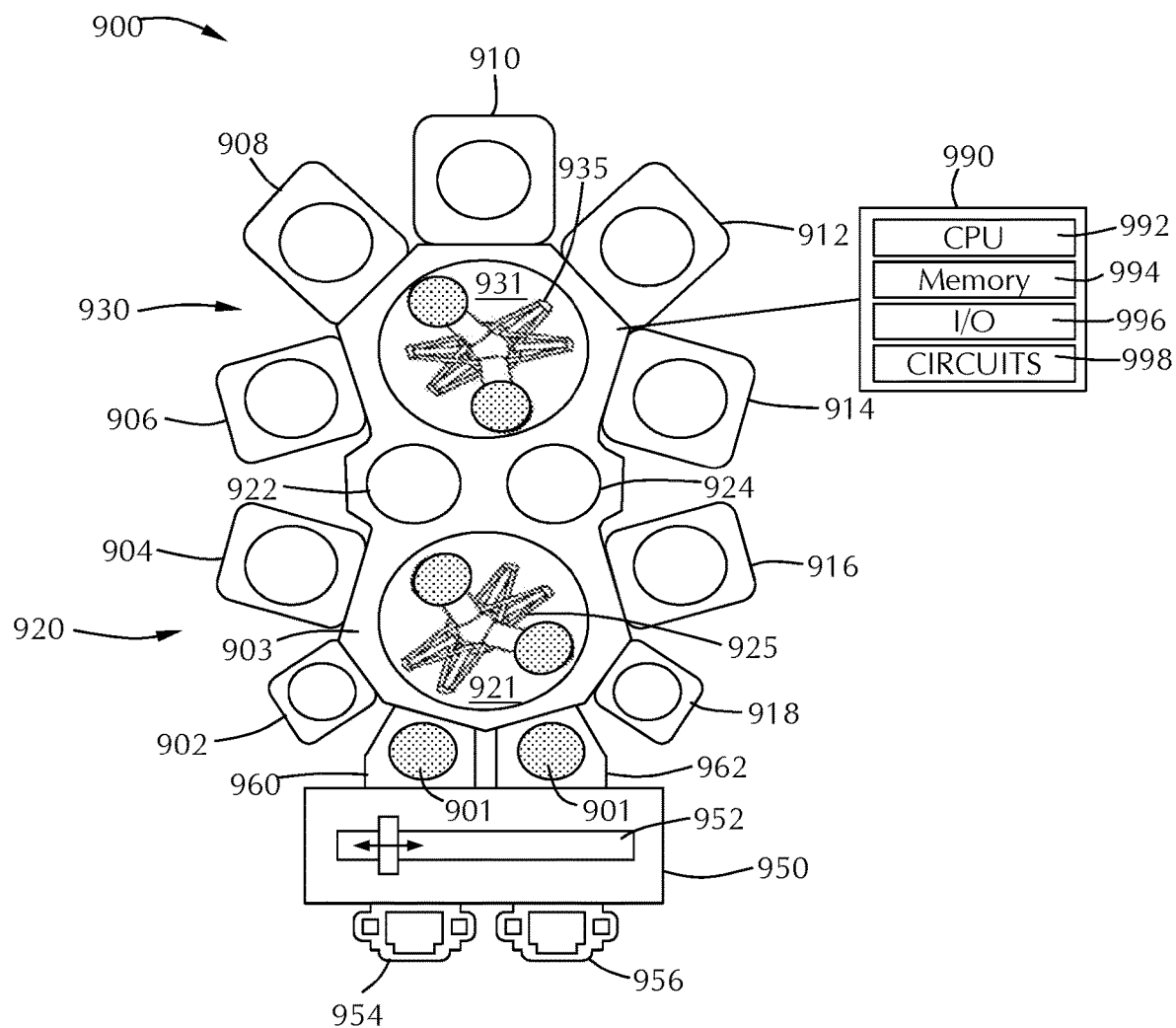
FIG. 4 illustrates a cluster tool according to one or more embodiments.

Additional embodiments of the disclosure are directed to processing tools 900 for the formation of the devices and practice of the methods described, as shown in FIG. 4. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a physical vapor deposition chamber, a UV curing chamber, an ICP chamber, an etching chamber, and the like. The particular arrangement of process chambers and components can be varied depending on the cluster tool and should not be taken as limiting the scope of the disclosure.

In some embodiments, the cluster tool 900 includes at least one physical vapor deposition chamber. In some embodiments, the cluster tool 900 includes a physical vapor deposition chamber having a remote plasma source connected to the central transfer station.

In the embodiment shown in FIG. 3, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a molecular layer deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control a deposition chamber to deposit a film on a wafer at a temperature in the range of about 20° C. to about 400° C.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a physical vapor deposition chamber and a remote plasma source; a UV curing chamber; an ICP chamber; and a controller connected to the central transfer station and the plurality of process stations, the controller configured to activate the robot to move the wafer between process stations, and to control a process occurring in each of the process stations.

In some embodiments, the controller 990 has one or more of: a configuration to move a substrate from the central transfer station to the at least one deposition chamber; a configuration to move a substrate from the at least one deposition chamber to the central transfer station; a configuration to move a substrate from the central transfer station to the at least one annealing chamber; a configuration to move a substrate from the at least one annealing chamber to the central transfer station; a configuration to expose a substrate to a first carbon precursor to form a first precursor terminated surface on the substrate; a configuration to expose the substrate to a second carbon precursor to react with the first precursor terminated surface to form a carbon polymer film on the substrate; a configuration to expose the carbon polymer film on a substrate to a plasma treatment; or a configuration to anneal the carbon polymer film.

Some embodiments of the disclosure are directed to non-transitory computer readable medium including instructions, that, when executed by a controller of a processing chamber, causes the processing chamber to perform operations to: expose a substrate to a first carbon precursor in a processing chamber; purge the processing chamber of the first carbon precursor; expose the substrate a second carbon precursor in the processing chamber; purge the processing chamber of the second carbon precursor; move the substrate from the processing chamber to an annealing chamber; and/or anneal the substrate in the annealing chamber.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
   exposing a substrate to a first carbon precursor to form a first precursor terminated surface on the substrate;
   exposing the first precursor terminated surface to a second carbon precursor to form a conformal carbon polymer film on the substrate; and
   annealing the carbon polymer film at a temperature up to 400° C., wherein annealing the carbon polymer film causes the carbon polymer film to decrease in thickness less than 20%.

2. The method of claim 1, wherein the first carbon precursors comprises an aromatic compound.

3. The method of claim 1, wherein the first carbon precursor comprises two functional groups.

4. The method of claim 3, wherein the two functional groups are the same and are selected from the group consisting of cyano (—CN), cyanate (—OCN), isocyanate (—NCO), thiocyanate (—SCN), isothiocyanate (—NCS), aldehyde (—CHO), acyl chloride (—COCl), acid anhydride (—C(O)OC(O)—), amines (—NR$_2$) and amides (—C(O)NR$_2$), where each R is independently selected from hydrogen, C1-C6 alkyl group.

5. The method of claim 1, wherein the first carbon compound comprises 1,4-phenylene diisocyanate (DIC).

6. The method of claim 1, wherein the second carbon compound comprises two functional groups.

7. The method of claim 6, wherein the two functional groups are the same.

8. The method of claim 1, wherein the second carbon compound comprises one or more of ethylene diamine (EDA) or phenylene diamine (PDA).

9. The method of claim 1, wherein the carbon polymer film is an alternating copolymer.

10. The method of claim 1, wherein the carbon polymer film has a carbon content in the range of 40% to 90%, a nitrogen content in the range of 2% to 40% and an oxygen content in the range of 1% to 20%.

11. The method of claim 1, wherein the substrate surface comprises one or more of silicon (Si), silicon nitride (SiN) or copper (Cu).

12. The method of claim 1, wherein the substrate surface is pre-treated to form amine terminations.

13. The method of claim 12, wherein the first precursor terminated surface comprises isocyanate terminations.

14. The method of claim 1, wherein the substrate comprises one or more surface features having an aspect ratio greater than 5:1 and the carbon polymer film is a conformal film.

15. The method of claim 1, further comprising exposing the carbon polymer film to a plasma treatment to enhance thermal stability of the carbon polymer film.

16. The method of claim 1, wherein the substrate is maintained at a temperature less than 100° C.

* * * * *